(12) United States Patent
Yamamoto et al.

(10) Patent No.: US 9,392,689 B2
(45) Date of Patent: Jul. 12, 2016

(54) METAL-CLAD LAMINATE, METHOD FOR PRODUCING SAME, AND FLEXIBLE PRINTED BOARD

(75) Inventors: Yoshihisa Yamamoto, Changsu (CN); Hiroyuki Yoshimoto, Settsu (JP); Hideto Nakagawa, Settsu (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 13/881,059

(22) PCT Filed: Oct. 25, 2011

(86) PCT No.: PCT/JP2011/074530
§ 371 (c)(1),
(2), (4) Date: Apr. 23, 2013

(87) PCT Pub. No.: WO2012/057124
PCT Pub. Date: May 3, 2012

(65) Prior Publication Data
US 2013/0213696 A1    Aug. 22, 2013

(30) Foreign Application Priority Data
Oct. 25, 2010 (JP) ................... 2010-238984

(51) Int. Cl.
| | |
|---|---|
| B32B 7/00 | (2006.01) |
| H05K 1/03 | (2006.01) |
| H05K 3/38 | (2006.01) |
| B32B 15/092 | (2006.01) |
| B32B 37/14 | (2006.01) |
| C08L 63/00 | (2006.01) |
| B32B 38/10 | (2006.01) |

(52) U.S. Cl.
CPC ............ *H05K 1/0393* (2013.01); *B32B 15/092* (2013.01); *B32B 37/14* (2013.01); *C08L 63/00* (2013.01); *H05K 3/386* (2013.01); *B32B 38/10* (2013.01); *B32B 2270/00* (2013.01); *B32B 2457/08* (2013.01); *H05K 2201/015* (2013.01); *H05K 2201/0154* (2013.01); *Y10T 156/10* (2015.01); *Y10T 428/31522* (2015.04); *Y10T 428/31529* (2015.04)

(58) Field of Classification Search
CPC ................ H05K 2201/10355; H05K 1/0393; C09J 183/04; C09J 163/00; C09J 7/0217; B32B 27/08; H01L 2924/01079

USPC .......... 428/209, 355 R, 355 EP, 355 EN, 428/355 AC; 174/254, 259
See application file for complete search history.

(56) References Cited

U.S. PATENT DOCUMENTS

| | | | | |
|---|---|---|---|---|
| 3,773,713 A * | 11/1973 | Koizumi | ................ | C08L 27/16 523/435 |
| 4,557,977 A * | 12/1985 | Memmer | ................ | B05D 7/16 283/81 |
| 4,634,631 A * | 1/1987 | Gazit | ................ | B32B 15/08 428/421 |
| 4,960,827 A * | 10/1990 | Miyazaki | ............ | C08K 5/0025 525/101 |
| 5,103,293 A * | 4/1992 | Bonafino et al. | ............. | 257/702 |
| 5,126,192 A * | 6/1992 | Chellis et al. | ................ | 428/323 |
| 5,147,934 A * | 9/1992 | Ito | ................ | C08G 18/6279 525/124 |
| 5,367,026 A * | 11/1994 | Okude et al. | ................ | 525/199 |
| 5,670,593 A * | 9/1997 | Araki | ................ | C07C 33/423 526/240 |
| 6,254,972 B1 * | 7/2001 | Farquhar et al. | ............. | 428/209 |
| 6,620,513 B2 * | 9/2003 | Yuyama et al. | ............... | 428/416 |
| 6,713,183 B2 * | 3/2004 | Araki | ................ | B32B 7/12 156/333 |
| 2003/0026996 A1 * | 2/2003 | Araki | ................ | B32B 1/08 428/422 |
| 2008/0107866 A1 | 5/2008 | Iwasa et al. | | |

FOREIGN PATENT DOCUMENTS

| | | |
|---|---|---|
| CN | 101080957 A | 11/2007 |
| JP | 6-57077 A | 3/1994 |
| JP | 6-115000 A | 4/1994 |
| JP | 2003-183495 A | 7/2003 |
| JP | 2009-299008 A | 12/2009 |
| WO | 2010/053185 A1 | 5/2010 |

OTHER PUBLICATIONS

International Search Report for PCT/JP2011/074530 dated Jan. 24, 2012.
English translation of the International Preliminary Report on Patentability and Written Opinion of the International Searching Authority for PCT Appln. No. PCT/JP2011/074530 dated May 14, 2013.

* cited by examiner

*Primary Examiner* — Humera Sheikh
*Assistant Examiner* — Seth Dumbris
(74) *Attorney, Agent, or Firm* — Sughrue Mion, PLLC

(57) ABSTRACT

A metal-clad laminate, including metal foil, and a first resin layer arranged on the metal foil, the first resin layer including an epoxy resin and a fluoropolymer with a curable functional group. Also disclosed is a method of producing the metal-clad laminate.

4 Claims, No Drawings

METAL-CLAD LAMINATE, METHOD FOR PRODUCING SAME, AND FLEXIBLE PRINTED BOARD

CROSS REFERENCE TO RELATED APPLICATIONS

This application is a National Stage of International Application No. PCT/JP2011/074530 filed Oct. 25, 2011, claiming priority based on Japanese Patent Application No. 2010-238984 filed Oct. 25, 2010, the contents of all of which are incorporated herein by reference in their entirety.

TECHNICAL FIELD

The present invention relates to a metal-clad laminate, a method for producing the same, and a flexible printed circuit board.

BACKGROUND ART

Electrical devices, electronic devices, and communication devices have recently been significantly developed. These devices today are likely to utilize frequencies in a higher frequency band. Typically, these devices include various flexible printed circuit boards. The flexible printed circuit boards are therefore also desired to have properties including excellent electrical properties suited for frequencies in high frequency bands, and excellent heat resistance enough to withstand soldering.

Known materials for flexible printed circuit boards include, for example, a metal-polyimide complex that has excellent adhesion to metal foil and does not cause a decrease in the glass transition temperature, an increase in the coefficient of linear thermal expansion, an increase in the coefficient of hygroscopic expansion, or an increase in elastic modulus; and a polyimide resin and a polyamic acid vanish composition which can give such a metal-polyimide complex (for example, Patent Literature 1).

CITATION LIST

Patent Literature

Patent Literature 1: JP 2009-299008 A

SUMMARY OF INVENTION

Technical Problem

Flexible printed circuit boards are laminates each having two layers of a base material and a copper foil layer, or having three layers of a base material, an adhesive layer, and a copper foil layer. In the case of laminates having three layers, a polyimide has been used for a base material, and an epoxy resin or acrylic resin has been used for an adhesive layer. Such a laminate having three layers, however, does not have satisfactory insulation, adhesion, and heat resistance. In the case of laminates having two layers without an adhesive, which are also known, the polyimide resin used for a base material has low adhesion to metal foil, and are therefore required to be produced using a special method such as lamination, casting, and metallization, or to have a thermoplastic polyimide layer that serves as an adhesive layer.

The present invention provides, in view of the above current state of the art, a metal-clad laminate that includes metal foil and a base material firmly attached to each other, and thus shows excellent electrical properties.

Solution to Problem

One aspect of the present invention is a metal-clad laminate, including metal foil, and a first resin layer arranged on the metal foil, the first resin layer including an epoxy resin and a fluoropolymer with a curable functional group.

The metal-clad laminate of the present invention preferably further includes a second resin layer arranged on the first resin layer.

The curable functional group is preferably at least one functional group selected from the group consisting of hydroxy groups, carboxyl groups, amino groups, glycidyl groups, silyl groups, silanate groups, and isocyanate groups.

The second resin layer preferably includes a polyimide.

Another aspect of the present invention is a flexible printed circuit board, including a pattern circuit formed by etching the metal foil of the above metal-clad laminate.

Yet another aspect of the present invention is a method of producing a metal-clad laminate, including the step of producing a metal-clad laminate by attaching together metal foil and a film that includes an epoxy resin and a fluoropolymer with a curable functional group.

Yet another aspect of the present invention is a method of producing a metal-clad laminate, including the step of forming a first resin layer by applying to metal foil a composition that includes an epoxy resin and a fluoropolymer with a curable functional group.

Advantageous Effects of Invention

The metal-clad laminate of the present invention includes a first resin layer and metal foil firmly attached to each other, and thus shows excellent electrical properties.

DESCRIPTION OF EMBODIMENTS

The metal-clad laminate of the present invention is a metal-clad laminate that includes metal foil, and a first resin layer arranged on the metal foil, the first resin layer including an epoxy resin and a fluoropolymer with a curable functional group. The first resin layer and the metal foil are therefore firmly attached to each other. The first resin layer also provides excellent insulation, and therefore shows excellent electrical properties which are as good as those of a conventional metal-clad laminate including a polyimide base material.

As long as the metal-clad laminate of the present invention includes metal foil and the first resin layer, the metal-clad laminate may further include other layers. For each of the metal foil and the first resin layer, one material may be used, or two or more materials may be used.

The first resin layer includes an epoxy resin and a fluoropolymer with a curable functional group. For each of the epoxy resin and the fluoropolymer, one material may be used, or two or more materials may be used. As long as the first resin layer includes an epoxy resin and a fluoropolymer with a curable functional group, the first resin layer may include other component(s). Examples of the other component(s) include various additives described below. Here, if the first resin layer includes other component(s) as well as an epoxy resin and a fluoropolymer with a curable functional group, the amounts of the epoxy resin and the fluoropolymer with a curable functional group in the first resin layer are amounts that allow the total amount of the epoxy resin and the fluoropolymer with a curable functional group to be preferably 5 to 95% by mass, and more preferably 20 to 80% by mass, for each 100% by mass of the whole first resin layer.

Examples of the epoxy resin include Epicoat 828 (product of Shell Chemicals Japan Ltd.) as an epi-bis compound based on compounds including bisphenol A, alkyl-modified compounds such as EPICLON800, EPICLON4050, and EPICLON1121N (products of DIC), glycidyl ester compounds such as Shodyne (products of Showa Denko K.K.) and Araldite CY-183 (products of Ciba-Geigy), Novolak compounds such as Epicoat 154 (products of Shell Chemicals Japan Ltd.) and DEN431 and DEN438 (products of The Dow Chemical Company), cresolnovolak compounds such as ECN1280 and ECN1235 (products of Ciba-Geigy), and urethane-modified compounds such as EPU-6 and EPU-10 (products of Jiryu Corporation).

Various adhesive resins other than the epoxy resins mentioned above are usable if the conditions are appropriately set.

The weight average molecular weight of the epoxy resin is preferably 100 to 1000000. A weight average molecular weight of the epoxy resin in such a range enables the first resin layer and the metal foil to be firmly attached to each other. The weight average molecular weight of the epoxy resin is more preferably 1000 to 100000.

The weight average molecular weight of the epoxy resin can be measured by, for example, gel permeation chromatography (GPC).

Examples of the fluoropolymer with a curable functional group include a resinous polymer having a definite melting point, an elastomeric polymer exhibiting rubber elasticity, and a thermoplastic elastomeric polymer which has properties between these polymers.

The curable functional group is appropriately selected in consideration of the easiness in production of the polymer and the curing system for the polymer, but is preferably at least one functional group selected from the group consisting of hydroxy groups, carboxyl groups, amino groups, glycidyl groups, silyl groups, silanate groups, and isocyanate groups. Among these, at least one functional group selected from the group consisting of hydroxy groups, cyano groups, and silyl groups is preferred for their favorable curing reactivity, and hydroxy groups are particularly preferred for easy production of the polymer and the favorable reactivity. These curable functional groups are typically introduced into a fluoropolymer by copolymerizing the fluoropolymer with a monomer having a curable functional group.

The monomer having a curable functional group is, for example, preferably at least one selected from the group consisting of hydroxy group-containing monomers, carboxyl group-containing monomers, amino group-containing monomers, and silicone vinyl monomers, and is more preferably a hydroxy group-containing monomer.

(1-1) Hydroxy Group-Containing Monomers:

The hydroxy group-containing monomer is preferably hydroxy group-containing vinyl monomers without a carboxyl group, more preferably at least one selected from the group consisting of hydroxy group-containing vinyl ethers and hydroxy group-containing allyl ethers, and still more preferably a hydroxy group-containing vinyl ether.

The hydroxy group-containing vinyl ether is preferably at least one selected from the group consisting of 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether. Among these, at least one selected from the group consisting of 4-hydroxybutyl vinyl ether and 2-hydroxyethyl vinyl ether is particularly preferred in terms of excellent polymerization reactivity and excellent curability of the functional group.

The hydroxy group-containing allyl ether is preferably at least one selected from the group consisting of 2-hydroxyethyl allyl ether, 4-hydroxybutyl allyl ether, and glycerol monoallyl ether.

Examples of the hydroxy group-containing vinyl monomer include hydroxy alkyl esters of (meth)acrylic acid, such as 2-hydroxyethyl acrylate and 2-hydroxyethyl methacrylate.

(1-2) Carboxyl Group-Containing Monomers:

Examples of the carboxyl group-containing monomers include unsaturated monocarboxylic acids, unsaturated dicarboxylic acids, or monoesters of these acids which are represented by formula (II):

[Chem. 1]

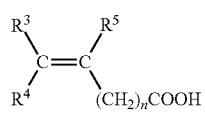

(II)

(wherein $R^3$, $R^4$, and $R^5$ are the same as or different from each other, each representing a hydrogen atom, alkyl group, carboxyl group, or ester group; and n is 0 or 1), or unsaturated dicarboxylic acids such as acid anhydride of an unsaturated dicarboxylic acid represented by formula (II) and polyunsaturated carboxylic acid vinyl esters; and carboxyl group-containing vinyl ether monomers represented by formula (III):

[Chem. 2]

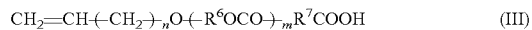

(III)

wherein $R^6$ and $R^7$ are the same as or different from each other, each representing a saturated or unsaturated linear or cyclic alkyl group; n is 0 or 1; and m is 0 or 1.

Specific examples of the unsaturated carboxylic acids include acrylic acid, methacrylic acid, vinylacetic acid, crotonic acid, cinnamic acid, itaconic acid, itaconic acid monoesters, maleic acid, maleic acid monoesters, maleic anhydride, fumaric acid, fumaric acid monoesters, vinyl phthalate, and vinyl pyromellitate. Among these, at least one selected from the group consisting of crotonic acid, itaconic acid, maleic acid, maleic acid monoesters, fumaric acid, and fumaric acid monoesters is preferred because they have low homopolymerizability, and thus do not easily form a homopolymer.

Specifically, for the carboxyl group-containing vinyl ether monomers represented by formula (III), one of 3-allyloxypropionic acid, 3-(2-allyloxyethoxycarbonyl)propionic acid, 3-(2-allyloxy butoxycarbonyl)propionic acid, 3-(2-vinyloxyethoxycarbonyl)propionic acid, and 3-(2-vinyloxybutoxycarbonyl)propionic acid, or a combination of two or more of these is/are used, for example. Among these, acids such as 3-allyloxypropionic acid and 3-(2-allyloxyethoxycarbonyl)propionic acid are preferred for advantages attributed to favorable stability and polymerization reactivity of the monomer.

(1-3) Amino Group-Containing Monomers:

Examples of the amino group-containing monomer include aminovinyl ethers represented by $CH_2=CH-O-(CH_2)_x-NH_2$ (x=0 to 10); allylamines represented by $CH_2=CH-O-CO(CH_2)_x-NH_2$ (x=1 to 10); aminomethyl styrene, vinylamine, acrylamide, vinylacetamide, and vinylformamide.

(1-4) Silicone Vinyl Monomers:

Examples of the silicone vinyl monomers include (meth)acrylates such as $CH_2$=$CHCO_2(CH_2)_3Si(OCH_3)_3$, $CH_2$=$CHCO_2(CH_2)_3Si(OC_2H_5)_3$, $CH_2$=$C(CH_3)CO_2(CH_2)_3Si(OCH_3)_3$, $CH_2$=$C(CH_3)CO_2(CH_2)_3Si(OC_2H_5)_3$, $CH_2$=$CHCO_2(CH_2)_3SiCH_3(OC_2H_5)_2$, $CH_2$=$C(CH_3)CO_2(CH_2)_3SiC_2H_5(OCH_3)_2$, $CH_2$=$C(CH_3)CO_2(CH_2)_3Si(CH_3)_2(OC_2H_5)$, $CH_2$=$C(CH_3)CO_2(CH_2)_3Si(CH_3)_2OH$, $CH_2$=$CHCO_2(CH_2)_3Si(OCOCH_3)_3$, $CH_2$=$C(CH_3)CO_2(CH_2)_3SiC_2H_5(OCOCH_3)_2$, $CH_2$=$C(CH_3)CO_2(CH_2)_3SiCH_3(N(CH_3)COCH_3)_2$, $CH_2$=$CHCO_2(CH_2)_3SiCH_3[ON(CH_3)C_2H_5]_2$ and $CH_2$=$C(CH_3)CO_2(CH_2)_3SiC_6H_5[ON(CH_3)C_2H_5]_2$; vinylsilanes such as $CH_2$=$CHSi[ON$=$C(CH_3)(C_2H_5)]_3$, $CH_2$=$CHSi(OCH_3)_3$, $CH_2$=$CHSi(OC_2H_5)_3$, $CH_2$=$CHSiCH_3(OCH_3)_2$, $CH_2$=$CHSi(OCOCH_3)_3$, $CH_2$=$CHSi(CH_3)_2(OC_2H_5)$, $CH_2$=$CHSi(CH_3)_2SiCH_3(OCH_3)_2$, $CH_2$=$CHSiC_2H_5(OCOCH_3)_2$, $CH_2$=$CHSiCH_3[ON(CH_3)C_2H_5]_2$, vinyl trichlorosilane, and partial hydrolysates of these; and vinyl ethers such as trimethoxysilyl ethyl vinyl ether, triethoxysilyl ethyl vinyl ether, trimethoxysilyl butyl vinyl ether, methyldimethoxysilyl ethyl vinyl ether, trimethoxysilylpropyl vinyl ether, and triethoxysilylpropyl vinyl ether.

The polymerization unit based on monomers with a curable functional group preferably constitutes 8 to 30 mol % of the whole polymerization units of the fluoropolymer with a curable functional group. The lower limit is more preferably 10 mol %, and the upper limit is more preferably 20 mol %.

The proportion of the polymerization unit based on monomers with a curable functional group in the fluoropolymer with a curable function group can be calculated from the ratio of the amount used of the monomer with a curable functional group to the amount used of the whole monomers (synthetic raw materials of the fluoropolymer with a curable functional group). The proportions of other monomer units herein can also be calculated in the same manner.

The fluoropolymer with a curable functional group preferably includes polymerization units based on fluorine-containing vinyl monomers.

The fluorine-containing vinyl monomer is preferably at least one selected from the group consisting of tetrafluoroethylene (TFE), vinylidene fluoride, chlorotrifluoroethylene (CTFE), vinyl fluoride, hexafluoropropylene, and perfluoroalkyl vinyl ether. In terms of excellent properties including dielectric constant, low dielectric loss tangent, dispersibility, moisture resistance, heat resistance, fire retardancy, adhesion, copolymerizability, and chemical resistance, at least one selected from the group consisting of TFE, CTFE, and vinylidene fluoride is more preferred. In terms of low dielectric constant, low dielectric loss tangent, and excellent weather resistance and moisture resistance, at least one selected from the group consisting of TFE and CTFE is still more preferred, and TFE is particularly preferred.

The repeating unit (polymerization unit) based on fluorine-containing vinyl monomers preferably accounts for 20 to 49 mol % of the whole polymerization units constituting the fluoropolymer with a curable functional group. The lower limit is more preferably 30 mol %, and still more preferably 40 mol %. The upper limit is more preferably 47 mol %.

The fluoropolymer with a curable functional group preferably includes a repeating unit based on at least one vinyl monomer (here, vinyl monomers with a fluorine atom are excluded) selected from the group consisting of carboxylic acid vinyl esters, alkyl vinyl ethers, and non-fluorinated olefins. Carboxylic acid vinyl esters have an effect of improving the compatibility. Examples of the carboxylic acid vinyl esters include vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butyl-benzoate. Examples of the alkyl vinyl ethers include methyl vinyl ether, ethyl vinyl ether, butyl vinyl ether, and cyclohexyl vinyl ether. Examples of the non-fluorinated olefins include ethylene, propylene, n-butene, and isobutene.

The repeating unit based on a vinyl monomer (here, vinyl monomers with a fluorine atom are excluded) preferably forms the whole polymerization units other than the polymerization units formed by the repeating units based on monomers with a curable functional group and the repeating units based on fluorine-containing vinyl monomers, regarding the whole polymerization units constituting the fluoropolymer with a curable functional group.

For the above reasons, one suitable embodiment of the present invention is an embodiment in which the fluoropolymer with a curable functional group in the present invention includes the polymerization unit based on monomers with a curable functional group, the polymerization unit based on fluorine-containing vinyl monomers, and the polymerization unit based on vinyl monomers, at a molar ratio of 8 to 30/20 to 49/21 to 72. The ratio (molar ratio) of the amounts of the polymerization units is more preferably 10 to 20/30 to 47/33 to 60.

Examples of fluoropolymers into which a curable functional group is introduced include the following compounds in terms of the constitutional units.

Examples of the fluoropolymer with a curable functional group include perfluoroolefin polymers mainly having a perfluoroolefin unit, CTFE polymers mainly having a chlorotrifluoroethylene (CTFE) unit, VdF polymers mainly having a vinylidene fluoride (VdF) unit, and fluoroalkyl group-containing polymers mainly having a fluoroalkyl unit.

(1) Perfluoroolefin Polymer Mainly Having Perfluoroolefin Unit

Specific examples of such a polymer include a homopolymer of tetrafluoroethylene (TFE), a copolymer of TFE with a compound such as hexafluoropropylene (HFP) and perfluoro(alkyl vinyl ether) (PAVE), and a copolymer of these polymers with other monomer(s) copolymerizable with these polymers.

Examples of the other copolymerizable monomer(s) include, but not limited to, carboxylic acid vinyl esters such as vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butyl benzoate; alkyl vinyl ethers such as methyl vinyl ether, ethyl vinyl ether, butyl vinyl ether, and cyclohexyl vinyl ether; non-fluoroolefins such as ethylene, propylene, n-butene, and isobutene; and fluoromonomers such as vinylidene fluoride (VdF), chlorotrifluoroethylene (CTFE), vinyl fluoride (VF), and fluorovinyl ethers.

Among these, TFE polymers mainly having TFE are preferred in terms of excellent pigment dispersibility, weather resistance, copolymerizability, and chemical resistance.

Specific examples of the perfluoroolefin polymer include copolymers of TFE/isobutylene/hydroxybutyl vinyl ether/other monomer(s), copolymers of TFE/vinyl versatate/hydroxybutyl vinyl ether/other monomer(s), and copolymers of TFE/VdF/hydroxybutyl vinyl ether/other monomer(s). Particularly, at least one copolymer selected from the group consisting of copolymers of TFE/isobutylene/hydroxybutyl vinyl ether/other monomer(s) and copolymers of TFE/vinyl versatate/hydroxybutyl vinyl ether/other monomer(s) is preferred.

(2) CTFE Polymer Mainly Having Chlorotrifluoroethylene (CTFE) Unit

Specific examples of such a polymer include copolymers of CTFE/hydroxybutyl vinyl ether/other monomer(s).

(3) VdF Polymer Mainly Having Vinylidene Fluoride (VdF) Unit

Specific examples of such a polymer include copolymers of VdF/TFE/hydroxybutyl vinyl ether/other monomer(s).

(4) Fluoroalkyl Group-Containing Polymer Mainly Having Fluoroalkyl Unit

Specific examples of such a polymer include a copolymer of $CF_3CF_2(CF_2CF_2)_nCH_2CH_2OCOCH=CH_2$ (mixture of n=3 and 4)/2-hydroxyethyl methacrylate/stearylacrylate.

Among these polymers, perfluoroolefin polymers are preferred in terms of weather resistance and moisture resistance.

The weight average molecular weight of the fluoropolymer with a curable functional group is preferably 5000 to 100000. A weight average molecular weight of the fluoropolymer with a curable functional group in such a range enables more firm attachment between the first resin layer and metal foil. The weight average molecular weight of the fluoropolymer with a curable functional group is preferably 20000 to 40000.

The weight average molecular weight of the fluoropolymer with a curable functional group can be measured in the same manner as that for the weight average molecular weight of the epoxy resin.

The mass ratio of the fluoropolymer with a curable functional group and the epoxy resin in the first resin layer is preferably 5:95 to 90:10, and more preferably 10:90 to 70:30. Too large an amount of the fluoropolymer with a curable functional group may decrease the adhesion, while too large an amount of the epoxy resin may decrease the insulation, moisture resistance, heat resistance, and fire retardancy.

The metal-clad laminate of the present invention includes metal foil and the first resin layer. The first resin layer has excellent insulation, and functions as a base material for the metal-clad laminate.

The metal-clad laminate of the present invention may include a second resin layer arranged on the first resin layer. That is, the metal-clad laminate of the present invention may include metal foil, the first resin layer, and the second resin layer stacked in the stated order. The first resin layer functions not only as a base material but also as an adhesive layer for attaching together the metal foil and the second resin layer.

The metal-clad laminate of the present invention may have another first resin layer on a surface (opposite surface) of the metal foil different from the surface with the first resin layer. That is, the metal-clad laminate of the present invention may include the first resin layer, the metal foil, and the first resin layer stacked in the stated order, or may include the first resin layer, the metal foil, the first resin layer, and the second resin layer in the stated order.

For the second resin layer, a resin used for conventional printed circuit boards can be used. Still, the second resin layer is preferably made of at least one resin selected from the group consisting of polyethylene terephthalate and polyimide, and is more preferably made of polyimide in terms of heat resistance.

For the first resin layer, a film including an epoxy resin and a fluoropolymer with a curable functional group which has a thickness of 1 to 150 μm can be used. In the case of attaching together metal foil and the second adhesive layer with the first resin layer in between, the thickness of the dried first resin layer may be 1 to 100 μm.

For the second resin layer, a resin film having a thickness of 1 to 150 μm can be used.

Examples of the metal foil include metal foils made of copper, aluminum, iron, nickel, chromium, molybdenum, tungsten, zinc, and alloys of these metals. The metal foil is preferably copper foil. For improvement of the adhesion, the surface of the metal foil may be chemically or mechanically treated by siding, nickel plating, or copper-zinc alloy plating, or with aluminum alcoholate, aluminum chelate, or a silane coupling agent.

A flexible printed circuit board including a pattern circuit formed by etching the metal foil of the metal-clad laminate is one aspect of the present invention.

The flexible printed circuit board of the present invention may have a cover lay film on the metal-clad laminate. A resin layer including an epoxy resin and a fluoropolymer with a curable functional group may be arranged between the cover lay film and the metal-clad laminate.

The metal-clad laminate of the present invention can be produced by the method of producing a metal-clad laminate according to the present invention.

Another aspect of the present invention is a method of producing a metal-clad laminate which includes the step of producing a metal-clad laminate by attaching together metal foil and a film that includes an epoxy resin and a fluoropolymer with a curable functional group. Hereinafter, such a method of producing a metal-clad laminate is also referred to as a first production method of the present invention.

The attachment is preferably performed by stacking metal foil and a film that includes an epoxy resin and a fluoropolymer with a functional group, and thermocompression bonding the metal foil and the film by a hot press at 50 to 300° C.

The first production method of the present invention may further include the step of molding a composition that includes an epoxy resin and a fluoropolymer with a curable functional group to obtain a film that includes an epoxy resin and a fluoropolymer with a curable functional group. Examples of the molding method include, but not particularly limited to, melt extrusion molding, solvent casting, and spraying. The composition including an epoxy resin and a fluoropolymer with a curable functional group may include an organic solvent and a curing agent as described later, and may also include additives such as a curing accelerator, a pigment dispersant, a defoaming agent, a leveling agent, an UV absorbent, a light stabilizer, a thickener, an adhesion improving agent, and a matting agent.

Yet another aspect of the present invention is a method of producing a metal-clad laminate which includes the step of applying a composition including an epoxy resin and a fluoropolymer with a curable functional group to metal foil, to obtain a first resin layer. Hereinafter, such a method of producing a metal-clad laminate is also referred to as a second production method of the present invention.

The second production method of the present invention may further include, after forming a first resin layer, the step of attaching together a resin film for forming a second resin layer and the first resin layer, thereby forming a metal-clad laminate that includes metal foil and the first and second resin layers. Examples of the resin film include films made of a resin suitable for forming a second resin layer.

The method of attaching the resin film is preferably a method of thermocompression bonding using a hot press at 50 to 300° C.

Examples of the method of applying to metal foil a composition for forming the first resin layer in the second production method of the present invention include brush coating, dip coating, spray coating, comma coating, knife coating, die coating, lip coating, roll coater coating, and curtain coating. The composition after the application can be dried for curing at 25 to 200° C. for one minute to one week using a device such as a hot air drying furnace.

Yet another aspect of the present invention is a method of producing a metal-clad laminate which includes the steps of applying a composition that includes an epoxy resin and a fluoropolymer with a curable functional group to a resin film for forming a second resin layer, thereby forming a first resin layer, which results in a laminate including the first resin layer and the second resin layer; and attaching metal foil to the first resin layer of the laminate to produce a metal-clad laminate that includes metal foil and the first and second resin layers. Hereinafter, such a method of producing a metal-clad laminate is also referred to as a third production method of the present invention.

Examples of the resin film include films made of a resin suitable for forming a second resin layer.

Examples of the method of applying to a resin film a composition for forming the first resin layer in the third production method of the present invention include brush coating, dip coating, spray coating, comma coating, knife coating, die coating, lip coating, roll coater coating, and curtain coating. The composition after the application can be dried for curing at 25 to 200° C. for one minute to one week, using a device such as a hot air drying furnace.

In the third method of the present invention, the method of attaching metal foil to the first resin layer of the laminate including the first resin layer and the second resin layer is preferably a method of stacking metal foil and the laminate including the first resin layer and the second resin layer to attach together the first resin layer of the laminate and the metal foil, and thermocompression bonding the resulting product by a hot press at 50 to 300° C.

The composition for forming the first resin layer includes an epoxy resin and a fluoropolymer with a curable functional group. Usable fluoropolymer with a functional group and epoxy resin are the compounds described above. In addition to these compounds, the composition may further include an additive such as a curing agent.

The composition preferably includes a curing agent. The curing agent is preferably at least one selected from the group consisting of isocyanates, melamine resins, and phenol resins.

Examples of the isocyanates include aliphatic isocyanates such as butane diisocyanate, pentane diisocyanate, hexamethylene diisocyanate (HDI), and triisocyanate nonane; alicyclic isocyanates such as a cyclohexyl isocyanate and isophorone diisocyanate (IPDI); and aromatic isocyanates such as tolylene diisocyanate (TDI) and 4,4'-diphenylmethane diisocyanate (MDI). In terms of weather resistance, aliphatic and alicyclic isocyanates are preferred.

Examples of the melamine resin include compounds obtained by reacting a methylol melamine derivative, producible by condensing melamine and formaldehyde, with a lower alcohol such as methyl alcohol, ethyl alcohol, isopropyl alcohol, butyl alcohol, and isobutyl alcohol for etherification; and mixtures of these compounds.

Examples of the methylol melamine derivative include monomethylolmelamine, dimethylolmelamine, trimethylolmelamine, tetramethylolmelamine, pentamethylolmelamine, and hexamethylolmelamine.

Melamine resins can be classified into fully alkylated ones, methylol ones, imino ones, and methylol/imino ones depending on the degree of alkoxylation, and any of these can be used for the present invention.

Examples of the phenol resin include Novolac phenol resins.

The composition may include additives suitable for the required properties. Examples of the additives include curing accelerators, pigment dispersants, defoaming agents, leveling agents, UV absorbents, light stabilizers, thickeners, adhesion improvers, and matting agents.

The curing accelerator may be a known curing accelerator such as tin-based ones, ones based on another metal, organic acid-based ones, amino-based ones, or phosphorus-based ones.

The composition preferably includes an organic solvent. Examples of the organic solvent include esters such as ethyl acetate, butyl acetate, isopropyl acetate, isobutyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethylformamide and N,N-dimethylacetamide; aromatic hydrocarbons such as toluene and xylene; alcohols such as propylene glycol methyl ether; hydrocarbons such as hexane and heptane; and mixed solvents of these organic solvents.

The composition preferably has a solids concentration of 10 to 80% by mass of the epoxy resin and the fluoropolymer with a functional group together. A solids concentration in this range gives an appropriate viscosity to the composition, and thus enables the applied composition to form a uniform coating film.

The composition can be used as an adhesive layer of a metal-clad laminate, and is also suitable for uses such as a sealing agent. Examples of the sealing agent include LED sealing agents, solar cell sealing agents, semiconductor sealing agents, and organic EL sealing agents.

EXAMPLES

The present invention will be described based on examples which, however, are not intended to limit the scope of the present invention.

The values in the examples were measured by the following methods.

[Relative Permittivity and Dielectric Loss Tangent]

A coating film described in a reference example was formed on a 50-μm-thick base material. The relative permittivity and tan δ of the coating film including the base material were measured.

(Method of Measuring Tan δ)

Changes in the resonant frequency (12 GHz) and Q factor of a cavity resonator with the produced film were determined by a network analyzer, so that the relative permittivity and tan δ of the film were calculated from the following formula.

$$\tan\delta = (1/Q_u) \times \{1 + (W_2/W_1)\} - (P_c/\omega W_1)$$

$$\varepsilon_r = \left(\frac{c}{\pi \times L \times F_0}\right)^2 \times \left\{X^2 - Y^2 \left(\frac{L}{2M}\right)^2\right\} + 1 \quad [\text{Math. 1}]$$

$$X \tan X = (L/2M)\, Y \cos Y$$

$$X = \frac{L}{2}\sqrt{\varepsilon_r \times k_0^2 - k_r^2}$$

$$Y = M\sqrt{k_0^2 - k_r^2}$$

$$k_0 = \frac{\varpi}{c}$$

$$\varpi = 2\pi F_0$$

$$k_r = \frac{3.8317}{D/2}$$

-continued $$Q_u = \frac{Q_L}{1 - 10^{(-Id/20)}}$$

$$Q_L = \frac{F_0}{F_1 \times F_2}$$

$$W_1 = \frac{1}{8} \times \varepsilon_r \times \varepsilon_0 \times L \times \pi \times \varpi^2 \times \mu_0^2 \times J_1^2 \times J_0^2 \times \left(1 + \frac{\sin X}{2X}\right)$$

$$W_2 = \frac{1}{4} \times \varepsilon_0 \times M \times \pi \times \left(1 - \frac{\sin 2Y}{2Y}\right) \times \varpi^2 \times \mu_0^2 \times J_1^2 \times J_0^2$$

$$P_C = P_1 + P_2 + P_3$$

$$P_1 = \frac{1}{2} \times Rs \times \frac{D}{2} \times L \times \pi \times \left(1 - \frac{\sin X}{2X}\right) \times \left(\frac{J_1 \times 2}{D}\right)^4 \times J_0^2$$

$$P_2 = \frac{1}{2} \times \left(\frac{-\cos X}{\sin Y}\right)^2 \times Rs \times \frac{D}{2} \times$$

$$M \times \pi \times \left(1 - \frac{\sin 2Y}{2Y}\right) \times \left(\frac{J_1 \times 2}{D}\right)^4 \times J_0^2$$

$$P_3 = \frac{1}{2} \times \left(\frac{-\cos X}{\sin Y}\right)^2 \times Rs \times \pi \times \left(J_1 \times J_0 \times \frac{Y}{M}\right)^2$$

The reference signs in the formula are defined as described below.
D: Diameter of cavity resonator (mm)
M: One-side length of cavity resonator (mm)
L: Length of sample (mm)
c: Velocity of light (m/s)
Id: Attenuation (dB)
$F_0$: Resonant frequency (Hz)
$F_1$: Upper frequency (Hz) with attenuation from resonance point of 3 dB
$F_2$: Bottom frequency (Hz) with attenuation from resonance point of 3 dB
$\varepsilon_0$: Vacuous dielectric constant (H/m)
$\varepsilon_r$: Relative permittivity of sample
$\mu_0$: Vacuous magnetic permeability (H/m)
Rs: Effective surface resistance (Ω) with surface roughness of the conducting cavity
$J_0$: −0.402759
$J_1$: 3.83171

(Measurement of Adhesion Between First Resin Layer and Base Material)

The adhesion was evaluated by the cross-cut cellophane tape peeling test described in JIS K5600. The coating film was cut in a grid pattern with intervals of 1 mm using a utility knife. Cellophane tape was attached to the coating film and was then removed. A score of 10 points was given to the coating film if no pieces of the film was peeled off, a score of 8 points was given if 0 to 5% of the coating film was peeled off, a score of 6 points was given if 5 to 15% of the film was peeled off, a score of 4 points was given if 15 to 35% of the film was peeled off, a score of 2 points was given if 35 to 65% of the film was peeled off, and a score of 0 points was given if 65% or more of the film was peeled off.

Preparation Example 1

To 100 parts by mass of a hydroxy group-containing TFE copolymer (ZEFFLE GK570 produced by Daikin Industries, Ltd.) was added 13.3 parts by mass of an isocyanate curing agent (N3300 produced by Sumika Bayer Urethane Co., Ltd.), so that a curable coating material 1 was prepared.

Preparation Example 2

To 100 parts by mass of an epoxy resin (EPICLON 1121N produced by DIC) was added 28.3 parts by mass of a phenol curing agent (TD2090 produced by DIC), so that a curable coating material 2 was prepared.

Reference Example 1

The curable coating material 1 produced in Preparation Example 1 and the curable coating material 2 produced in Preparation Example 2 were mixed at a mass ratio of 30:70. The mixture was applied to a base material (Kapton from DU PONT-TORAY CO., LTD., thickness: 50 μm) to a thickness of 50 μm, cured and dried at 120° C. for 24 hours, and aged at 60° C. for 24 hours. Thereby, a cured coating film 1 was obtained. The relative permittivity, dielectric loss tangent, and adhesion of this cured film 1 were measured. Table 1 shows the results.

Reference Example 2

The curable coating material 1 produced in Preparation Example 1 and the curable coating material 2 produced in Preparation Example 2 were mixed at a mass ratio of 50:50. The mixture was applied to a base material (Kapton from DU PONT-TORAY CO., LTD., thickness: 50 μm) to a thickness of 50 μm cured and dried at 120° C. for 24 hours, and aged at 60° C. for 24 hours. Thereby, a cured coating film 2 was obtained. The relative permittivity, dielectric loss tangent, and adhesion of this cured film 2 were measured. Table 1 shows the results.

Reference Example 3

The curable coating material 1 produced in Preparation Example 1 and the curable coating material 2 produced in Preparation Example 2 were mixed at a mass ratio of 70:30. The mixture was applied to a base material (Kapton from DU PONT-TORAY CO., LTD., thickness: 50 μm) to a thickness of 50 μm, cured and dried at 120° C. for 24 hours, and aged at 60° C. for 24 hours. Thereby, a cured coating film 3 was obtained. The relative permittivity, dielectric loss tangent, and adhesion of this cured film 3 were measured. Table 1 shows the results.

Comparative Reference Example 1

The curable coating material 2 produced in Preparation Example 2 was applied to a base material (Kapton from DU PONT-TORAY CO., LTD., thickness: 50 μm) to a thickness of 50 μm, cured and dried at 120° C. for 24 hours, and aged at 60° C. for 24 hours. Thereby, a cured coating film 4 was obtained. The relative permittivity, dielectric loss tangent, and adhesion of this cured film 4 were measured. Table 1 shows the results.

Comparative Reference Example 2

The curable coating material 1 produced in Preparation Example 1 was applied to a base material (Kapton from DU PONT-TORAY CO., LTD., thickness: 50 μm) to a thickness of 50 μm, cured and dried at 120° C. for 24 hours, and aged at 60° C. for 24 hours. Thereby, a cured coating film 5 was obtained. The relative permittivity, dielectric loss tangent, and adhesion of this cured film 5 were measured. Table 1 shows the results.

TABLE 1

| | Mass ratio | | | Dielectric | | |
|---|---|---|---|---|---|---|
| | Hydroxy group-containing TFE copolymer | Epoxy resin | Film thickness (μm) | Relative permittivity | loss tangent ($\times 10^{-2}$) | Adhesion (points) |
| Reference Example 1 | 30 | 70 | 50 | 3.52 | 2.40 | 6 |
| Reference Example 2 | 50 | 50 | 50 | 3.40 | 2.03 | 6 |
| Reference Example 3 | 70 | 30 | 50 | 3.35 | 1.76 | 6 |
| Comparative Reference Example 1 | 0 | 100 | 50 | 3.88 | 2.87 | 6 |
| Comparative Reference Example 2 | 100 | 0 | 50 | 3.28 | 1.22 | 4 |

Example 1

The curable coating material 1 produced in Preparation Example 1 and the curable coating material 2 produced in Preparation Example 2 were mixed at a mass ratio of 30:70. The mixture was applied to a resin film (polyimide from DU PONT-TORAY CO., LTD., thickness: 50 μm) to a thickness of 50 μm, cured and dried at 120° C. for 24 hours, and aged at 60° C. for 24 hours. Thereby, a laminate of a coating film and a resin film was obtained. Copper foil (thickness: 50 μm) was attached to the coating film side of the laminate through one-hour heating, whereby a metal-clad laminate 1 was obtained. The peel strength of the metal-clad laminate 1 was measured in accordance with the peel test of JIS K6854. Table 2 shows the result.

Example 2

A metal-clad laminate 2 was obtained in the same manner as in Example 1, except that the curable coating material 1 produced in Preparation Example 1 and the curable coating material 2 produced in Preparation Example 2 were mixed at a mass ratio of 50:50. The peel strength of the metal-clad laminate 2 was measured in the same manner as in Example 1. Table 2 shows the result.

Example 3

A metal-clad laminate 3 was obtained in the same manner as in Example 1, except that the curable coating material 1 produced in Preparation Example 1 and the curable coating material 2 produced in Preparation Example 2 were mixed at a mass ratio of 70:30. The peel strength of the metal-clad laminate 3 was measured in the same manner as in Example 1. Table 2 shows the result.

Comparative Example 1

A metal-clad laminate 4 was obtained in the same manner as in Example 1, except that the coating material 2 produced in Preparation Example 2 was applied to a resin film. The peel strength of the metal-clad laminate 4 was measured in the same manner as in Example 1. Table 2 shows the results.

Comparative Example 2

A metal-clad laminate 5 was obtained in the same manner as in Example 1, except that the coating material 1 produced in Preparation Example 1 was applied to a resin film. The peel strength of the metal-clad laminate 5 was measured in the same manner as in Example 1. Table 2 shows the result.

TABLE 2

| | Mass ratio | | |
|---|---|---|---|
| | Hydroxy group-containing TFE copolymer | Epoxy resin | Peel strength (N/cm) |
| Example 1 | 30 | 70 | 18 |
| Example 2 | 50 | 50 | 17 |
| Example 3 | 70 | 30 | 16 |
| Comparative Example 1 | 0 | 100 | 20 |
| Comparative Example 2 | 100 | 0 | 12 |

INDUSTRIAL APPLICABILITY

The metal-clad laminate of the present invention includes metal foil and the base material firmly attached to each other, and thus shows excellent electrical properties. Accordingly, the metal-clad laminate is suitable as a material for producing a flexible printed circuit board which is usable for various devices. The flexible printed circuit board of the present invention includes the metal foil and the base material firmly attached to each other, and thus shows excellent electrical properties. Accordingly, the flexible printed circuit board is suitable for various electrical devices, electronic devices, and communication devices.

The invention claimed is:

1. A metal-clad laminate, comprising
   metal foil, and
   a first resin layer arranged on the metal foil,
   the first resin layer including an epoxy resin and a fluoropolymer, the fluoropolymer including repeating units having a curable functional group in an amount of 8 to 30 mol % of all repeating units constituting the fluoropolymer,
   further comprising a second resin layer arranged on the first resin layer,
   wherein the curable functional group is at least one functional group selected from the group consisting of hydroxy groups, carboxyl groups, amino groups, silyl groups, silanate groups, and isocyanate groups, wherein the second resin layer includes a polyimide, wherein the mass ratio of the fluoropolymer with a curable functional group and the epoxy resin in the first resin layer is 5:95 to 90:10, and wherein the fluoropolymer includes at least one repeating unit selected from the group consisting of 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, 6-hydroxyhexyl vinyl ether, 2-hydroxyethyl allyl ether, 4-hydroxybutyl allyl ether, glycerol monoallyl ether, 2-hydroxyethyl acrylate and 2-hydroxyethyl methacrylate.

2. A flexible printed circuit board, comprising a pattern circuit formed by etching the metal foil of the metal-clad laminate according to claim 1.

3. A method of producing the metal-clad laminate as claimed in claim 1, comprising the step of producing the metal-clad laminate by attaching together the metal foil and a film that includes the epoxy resin and the fluoropolymer with the curable functional group.

4. A method of producing the metal-clad laminate as claimed in claim 1, comprising the step of forming the first resin layer by applying to the metal foil a composition that includes the epoxy resin and the fluoropolymer with the curable functional group.

* * * * *